United States Patent [19]

Seki et al.

[11] Patent Number: 4,493,811
[45] Date of Patent: Jan. 15, 1985

[54] PREAMPLIFIER FOR A WIDE RANGE NEUTRON FLUX MONITORING SYSTEM

[75] Inventors: Eiji Seki, Yokohama; Ichiro Tai, Tokyo; Shimpey Shirayama, Yokohama; Toshiaki Itoh, Kawasaki; Yorimasa Endo, Tokorozawa; Toshiki Fukushima, Tokyo, all of Japan

[73] Assignee: Tokyo Shibaura Denki Kabushiki Kaisha, Kawasaki, Japan

[21] Appl. No.: 515,588

[22] Filed: Jul. 20, 1983

[30] Foreign Application Priority Data

Jul. 26, 1982 [JP] Japan .................. 57-129810

[51] Int. Cl.$^3$ ............................................. G21C 17/00
[52] U.S. Cl. ............................. 376/254; 376/259
[58] Field of Search ................ 376/254, 255, 259; 250/388, 390–392

[56] References Cited

U.S. PATENT DOCUMENTS

| | | | |
|---|---|---|---|
| 2,982,473 | 5/1961 | Goertzel ................ | 376/259 |
| 3,246,154 | 4/1966 | Harrison ................ | 376/259 |
| 3,296,440 | 1/1967 | Schultz et al. ........ | 376/254 |
| 3,330,954 | 7/1967 | Cox et al. ............. | 376/255 |
| 3,931,522 | 1/1976 | Rusch .................... | 376/254 |
| 4,045,282 | 8/1977 | Barbier ................. | 376/259 |
| 4,186,048 | 1/1980 | Thomas ................. | 376/254 |

FOREIGN PATENT DOCUMENTS 2634590 2/1978 Fed. Rep. of Germany.
109760 11/1974 German Democratic Rep..
55-20083 2/1980 Japan.

Primary Examiner—Sal Canaialosi
Attorney, Agent, or Firm—Oblon, Fisher, Spivak, McClelland & Maier

[57] ABSTRACT

A preamplifier for a wide range neutron flux monitoring system is disclosed. The preamplifier contains first to fifth amplifiers and a selection switch. The first amplifier for high frequency band amplification has a low input impedance circuit. The second amplifier for low frequency band amplification has a high input impedance circuit. Either of the first and second amplifiers can provide a path for the neutron flux level signal derived from a detector according to the frequency of the neutron flux level signal. The third amplifier (pulse amplifier) amplifies the output signal of the first amplifier and transfers the amplified signal to a pulse signal counting system. The lower frequency band Campbell signal is applied to the Campbelling system, through the second amplifier, the fourth amplifier (low frequency band Campbelling amplifier), and the selection switch. The higher frequency band Campbell signal is applied to the Campbelling system, through the first amplifier, the fifth amplifier (high frequency band Campbell amplifier), and the selection switch.

4 Claims, 9 Drawing Figures

PREAMPLIFIER FOR A WIDE RANGE NEUTRON FLUX MONITORING SYSTEM

BACKGROUND OF THE INVENTION

In general, a wide measuring range is required for a measuring system to measure the neutron flux level in a pressure vessel in a reactor. To measure a neutron flux level in a boiling water reactor (BWR), for example, the required measuring range is 11 decades. This implies that it is very difficult to obtain a satisfactory result by the use of a single measuring device. Conventionally, three measuring devices are combined to form a measuring system for neutron flux level measurement. Of these measuring devices, the first one is for low neutron flux level measurement. In the start-up range of the reactor operation, the neutron flux level is low and the reactor power is proportional to the counting rate of a neutron counter. The counting rate of the output pulses from a neutron counter capable of producing the pulse output up to 6 decades is sufficient for the neutron flux level measurement in this range. When the reactor operation enters the intermediate range between the start-up range and the power range, the neutron flux level increases to a high level. In this condition, the counting rate measuring method is insufficient for the reactor power measurement in this intermediate range. However, Compbell's theory is applicable for the reactor output measurement in this intermediate range, since the reactor output is proportional to a mean squared value of an AC component contained in the output signal of the neutron detector. Accordingly, in this range the neutron flux level can be measured using a measuring method based on Campbell's theory. In the power range, the reactor output is proportional to a DC component in the detector output signal. Accordingly, the reactor power in this range can be measured by measuring this DC component.

For measuring the reactor power of the BWR, for example, 4 neutron detectors are installed for the start-up range; 8 detectors for the intermediate range; and 100 to 200 detectors for the power range. The types of neutron detectors are different for each reactor operation range.

The measuring devices for the respective operation ranges will now be described in detail. FIG. 1 shows a neutron flux level measuring device for the start-up range. In FIG. 1, the output pulses of a neutron counter 1 installed in the pressure vessel are transferred to an input terminal of an input circuit 4 for a preamplifier 3 for pulse amplification, through a coaxial cable 2 which is 10 m to 20 m long. The input circuit 4 is a low input impedance circuit containing a capacitor C1 and a resistor R1. The input circuit 4 is impedance-matched to the coaxial cable 2 so as to prevent a signal reflection on the signal path therebetween. In FIG. 1, CO represents a capacitance of the coaxial cable 2, HV a high tension voltage terminal, and RH a resistor inserted between the high tension voltage terminal HV and the input terminal of the input circuit 4.

FIG. 2 shows a prior art flux level measuring device for intermediate range measurement. In the figure, a neutron detector 5 for the intermediate range is coupled to an input terminal of an input circuit 7 for a preamplifier 6 for voltage amplification. The preamplifier 6 is of the low noise type, which amplifies an AC component output (Campbell signal) from the neutron detector 5. The input impedance of the input circuit 7 is selected to be from 5 kiloohms to 10 kiloohms.

As already mentioned, it is technically very difficult to measure both the pulse signal and the Campbell signal by the use of the same measuring device. Specifically, it is very difficult to design a measuring device in which a pulse channel preamplifier and a Campbell channel preamplifier are connected to the same type of neutron detector for separating the signals from the neutron detector into a pulse signal and a Campbell signal and amplifying the corresponding signal so as to satisfy a required condition. It is also difficult to measure the reactor power so that the measuring range of the measuring device of FIG. 1 partially overlaps that of the measuring device of FIG. 2.

A neutron flux measuring device shown in FIG. 3 is so designed as to amplify a pulse signal and a Campbell signal from a wide range neutron detector 8 by using a single preamplifier 9. The preamplifier 9 which is provided with a low input impedance circuit 10, including a capacitor C3 and a resistor R3, has low noise performance and a wide frequency band. In the measuring device shown in FIG. 3, a noise voltage $e_n$ (r.m.s.) which is converted into an input signal to the preamplifier 9 is expressed by equation (1)

$$e_n \text{ (r.m.s)} = \sqrt{4kTR_{in}B} \qquad (1)$$

where Rin is resistance of the resistor R3, k a Boltzman constant, $1.3804 \times 10^{-25}$ Joul/°K, T an absolute temperature (°K), and B a frequency band width (Hz) of the preamplifier 9. For the noise voltage $e_n$ (r.m.s) as given above, a noise current $i_n$ (r.m.s), which is converted into an input current to the preamplifier 9 or an equivalent input noise current, is given by $$i_n \text{ (r.m.s)} = \sqrt{4kTB/R_{in}} \qquad (2)$$

Incidentally, the noise current is generated as a thermal noise from the resistor R3. The Campbell signal derived from the detector 8 is a current signal. Accordingly, if the Campbell signal from the wide range neutron detector 8 is smaller than the equivalent input noise current $i_n$ (r.m.s) as given by equation (2), it is impossible to detect the Campbell signal. Particularly, since the resistance Rin of the input resistor R3 of the preamplifier 9 is small (50 ohms or so), the equivalent input noise current $i_n$ (r.m.s) is extremely large. In the measurement of the Campbell signal using the measuring device shown in FIG. 3, the signal to noise ratio S/N is approximately 200 times that when the preamplifier 6 of FIG. 2, which has the input impedance circuit 10 including the resistor of 10 kiloohms, is used for measuring the same Campbell signal. For this reason, it is very difficult to amplify both the pulse signal and the Campbell signal by the single preamplifier 9 with a low input impedance.

A measuring device shown in FIG. 4 is designed to measure a pulse signal and a Campbell signal by using one neutron detector, and is disclosed in Kokai (Japanese Unexamined patent publication) No. 56-117193. In the measuring device of FIG. 4, the neutron flux level signal detected by a fission counter 11 is applied through the coaxial cable 2 to a preamplifier 13 with an input impedance circuit 12 which is made up of a capacitor C4 and a resistor R4, and to a preamplifier 15 with an input impedance circuit 14 which is made up of a capacitor C5 and a resistor R5. The preamplifier 13 amplifies a high frequency band signal which is derived from the fission counter 11 and delivered through the input impedance circuit 12. The preamplifier 15 amplifies the intermediate frequency band signal which is derived from the fission counter 11 and delivered through the input impedance circuit 14. Thus, the preamplifier 13 is a pulse amplifier for amplifying a pulse signal, while the preamplifier 15 is a Campbell signal amplifier for amplifying a Campbell signal.

In FIG. 4, the neutron flux level signal from the fission counter or the neutron detector 11 is routed to the input impedance circuit 12 or the input impedance circuit 14 depending on the frequency band of the signal. The preamplifier 13 amplifies only the high frequency component applied through the input impedance circuit 12. The preamplifier 15 amplifies only the intermediate frequency component, i.e., the Campbell signal, which is applied thereto through the input impedance circuit 14. Accordingly, the amplifiers 13 and 15 can amplify the neutron flux level signal with an improved S/N. The amplifiers 13 and 15 have frequency characteristics as shown in FIG. 5. In the graph, the x-distance represents frequency (Hz) and the y-distance an amplification factor (dB). In FIG. 5, $f_{CO}$, $f_{CL}$ and $f_{CH}$ indicate respectively the center frequency, the lower limit frequency and the upper limit frequency of the Campbell signals. $f_{PO}$, $f_{PL}$ and $f_{PH}$ respectively indicate the center frequency, the lower limit frequency and the upper limit frequency of the pulse signals. If the capacitance C4' of the capacitor C4 and the resistance R4' of the resistor R4 in the input impedance circuit 12 are selected so as to satisfy the following relations $$R5 >> R4 \text{ and } \frac{1}{2\pi f_{PO} \cdot C4'} \leq R4'$$

the pulse signal component can be smoothly supplied to the preamplifier 13. If the capacitance C5' of the capacitor C5 and the resistance R5' of the resistor R5 of the input impedance circuit 14 are selected so as to satisfy the following relations $$\frac{1}{2\pi f_{CO} \cdot C5'} < R5' \text{ and } \frac{1}{2\pi f_{CO} \cdot C4'} \geq R5'$$

the Campbell signal component can be smoothly sent to the preamplifier 15. The noise applied from the preamplifier 13 to the preamplifier 15 can be removed by properly selecting the frequency characteristic of the preamplifier 15.

A serious disadvantage of the measuring device shown in FIG. 4 is that it has a long response time. The response time means the time taken for the signal generated in the neutron detector 11 to be detected by a measuring system connected to the outputs of the preamplifiers 13 and 15.

The response time of the measuring device of FIG. 4 will be described in detail referring to FIG. 6. The Campbell signal from the neutron detector 11 includes a fluctuation component $\sigma_s$ with respect to the level S of the Campbell signal. The fluctuation component is represented by a mean squared value of the amplitude of the Campbell signal. The ratio of the fluctuation component $\sigma_s$ to the Campbell signal level S, viz. $\sigma_s/S$, is called a fluctuation factor, here denoted as I', and is given as $$I' = \frac{\sigma_s}{S} = \left\{ \frac{1}{2\pi\tau(f_{CL} + f_{CH})} + \frac{1}{2N_n \cdot \tau} \right\}^{\frac{1}{2}}$$

where $\tau$ is a response time, and Nn is a pulse rate (c.p.s) of the pulse signals derived from the neutron counter 11. For $f_{CL}$ and $f_{CH}$, see FIG. 5. When $f_{CL}=1$ kHz and $f_{CH}=10$ kHz, and $\tau$ is 1 msec, 10 msec, 0.1 sec or 1 sec, the fluctuation factor I' of the Campbell signal versus the pulse rate Nn (c.p.s) is as shown in FIG. 6. As seen from FIG. 6, for measuring the neutron flux level in the intermediate range while keeping the fluctuation factor I' below approximately 1%, the response time must be 0.1 sec or more. However, in the case where the response time is 0.1 sec or more, the measuring devices can not effectively measure the neutron flux level within a very short response time when the reactor power abruptly increases and the pulse rate Nn is very large.

The disadvantages of the prior measuring devices by which the pulse signal and the Campbell signal are measured by one neutron detector, will again be described as follows. If the measuring device shown in FIG. 3 is used for such a measurement, the S/N ratio is deteriorated in the measuring range of the Campbell signal. This leads to a narrow overlapping range of the Campbell signal measuring range and the pulse signal measuring range. As a result, the reliability of the measurement is deteriorated. In the measuring device shown in FIG. 4, the response time $\tau$ in the measuring range of the Campbell signals is made long. Therefore, the prior measuring device shown in FIG. 4 can not measure the neutron flux level when the neutron detector 11 produces pulse signals at high pulse rate and the measurement must be done within a short response time.

SUMMARY OF THE INVENTION

Accordingly, an object of the invention is to provide a preamplifier for a wide range neutron monitoring system in which neutron flux level signals detected by a single neutron detector are separated into a first frequency band region including pulse signals and a second frequency band region including Campbell signals, and these separated signals are amplified under predetermined conditions suitable for each frequency band.

A preamplifier for a wide range neutron monitoring system according to this invention is supplied with wide range neutron flux level signals from a neutron detector provided in a reactor and comprises a first amplifier for a high frequency band which includes a low input impedance circuit receiving at the input terminal thereof the wide range neutron flux level signals; a second amplifier for a low frequency band which includes a high input impedance circuit receiving at the input terminal thereof the wide range neutron flux level signals; a third amplifier for amplifying the pulse signals supplied from the output terminal of the first amplifier and for sending the output signals therefrom to a pulse signal counting system; a fourth amplifier for a low frequency band which receives the output signals from the second amplifier and amplifies Campbell signals of a first frequency range, the Campbell signals being included in the output signals from the second amplifier; a fifth amplifier for a high frequency band which receives the output signals from the first amplifier and amplifies Campbell signals of a second frequency range, the Campbell signals being included in the output signals from the first amplifier; and switching means for selectively switching the output signals from the fourth and fifth amplifiers to a Campbelling system.

DETAILED DESCRIPTION OF THE PREFERRED EMBODIMENT

Figure 7:
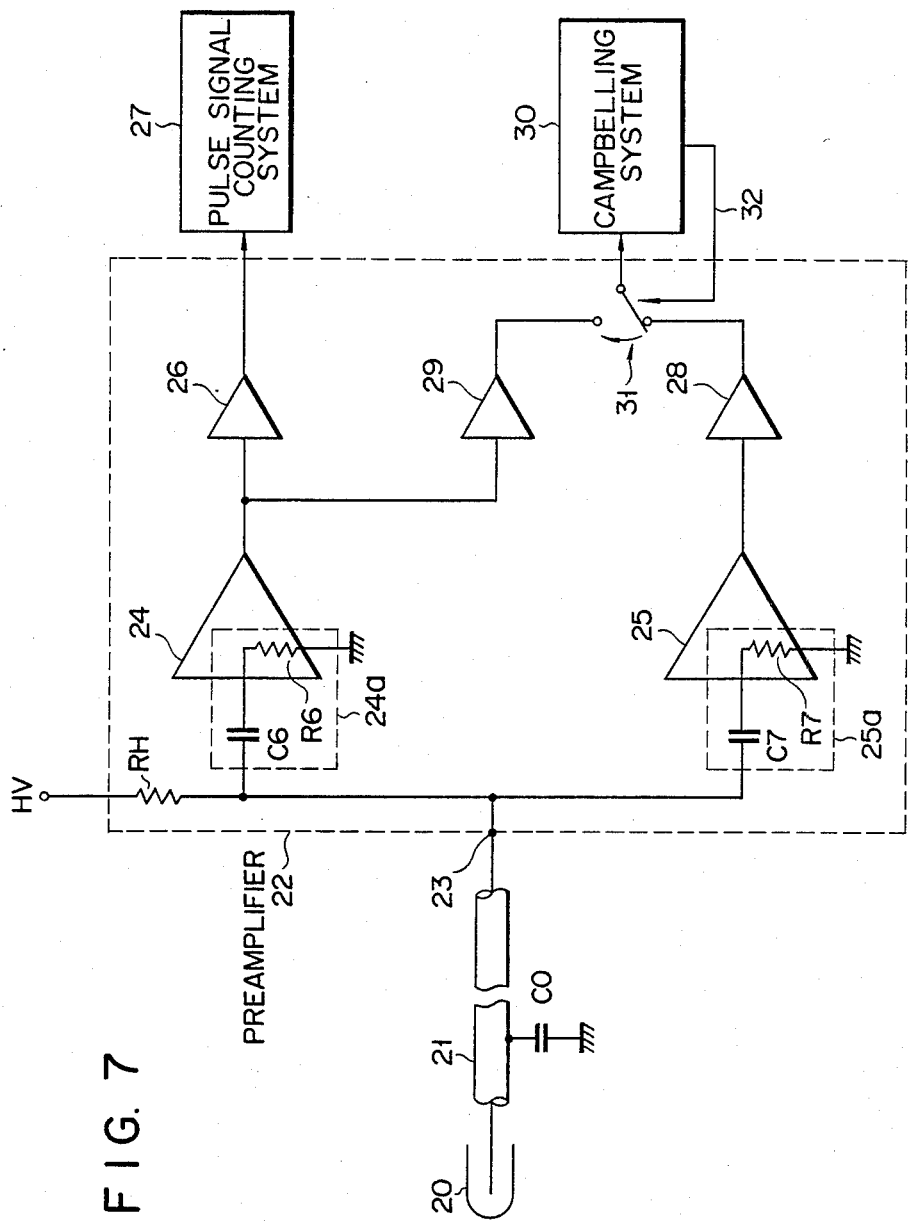
FIG. 7 is a block diagram of an embodiment of a neutron flux level measuring device according to the present invention.

In FIG. 7, a fission counter 20 as a neutron detector is installed in a pressure vessel (not shown) of a reactor. Neutron flux level signals detected by the fission counter 20 are transmitted to a signal input terminal 23 of a preamplifier 22, which is an embodiment of the present invention, through a coaxial cable 21. A high tension voltage HV is applied to the signal input terminal 23 through a resistor RH. A first amplifier 24 for high frequency band amplification includes a low input impedance circuit 24a comprised of an input resistor R6 grounded at one end and a coupling capacitor C6. Impedance of the input impedance circuit 24a is designated as Z6. An input terminal of the impedance circuit 24a is connected to the signal input terminal 23. If the capacitance of the capacitor C6 and resistance of the input resistor R6 are designated as C6' and R6' respectively, the following relation holds $$Z6 = R6' + \frac{1}{j\omega C6'}$$

where
$j^2 = -1$
$\omega = 2\pi f$
f = frequency of the input signal

Capacitance C6' of the capacitor C6 is set so that the input impedance Z6 has a minimum value, $Z6 \approx R6'$, when the frequency of input signal applied to the input terminal of the input impedance circuit 24a is more than 1 MHz. The input impedance circuit 24a is impedance-matched to the coaxial cable 21.

A second amplifier 25 for low frequency band amplification includes a high input impedance circuit 25a, in which an input resistor R7 grounded at one end and a coupling capacitor C7 are connected in series. The input terminal of the impedance circuit 25a is connected to the signal input terminal 23. Assume that resistance of the input resistor R7, capacitance of the capacitor C7, and impedance of the impedance circuit 25a are designated as R7', C7' and Z7, respectively. Capacitance C7' of the capacitor C7 is selected so that the impedance of the circuit 25a takes a minimum value, $Z7 \approx R7$, when the impedance circuit 25a receives input signals of more than 1 kHz. Further, resistances R7' and R6' are selected so as to satisfy the relation R7' >> R6'. Impedances Z6 and Z7 are also selected so as to satisfy the relation Z6 << Z7 for input signals of 1 MHz or more, and Z6 > Z7 for input signals of 1 kHz to 10 kHz, respectively.

A third amplifier 26 for pulse signal amplification (pulse signals in the start-up range of reactor operation) is connected at its input terminal to the output terminal of the first amplifier 24 and at its output terminal to an input terminal of a pulse counting system 27. A fourth amplifier 28 is a lower frequency band Campbell signal amplifier for amplifying lower frequency band Campbell signals included in the Campbell signals produced in the intermediate range of reactor operation. An input terminal of the fourth amplifier 28 is connected to the output terminal of the second amplifier 25. A fifth amplifier 29 is a higher frequency band Campbell signal amplifier for amplifying higher frequency band Campbell signals and connected at its input terminal to the output terminal of the first amplifier 24.

Further, a switch 31 is provided for selectively connecting either of the output terminals of the fourth amplifier 28 and fifth amplifier 29 to the input terminal of a Campbelling system 30. The switch 31 is connected to the output terminal of the fourth amplifier 28 while the lower frequency band Campbell signals are measured by the Campbelling system 30. Upon finishing the measurement of the lower frequency band Campbell signals, the switch 31 is turned to the output terminal of the fifth amplifier 29 by a switching signal 32 from the Campbelling system 30.

The operation of the preamplifier 22 will now be described. When the frequencies of the neutron flux level signals derived from the detector 20 are 1 MHz or more, the relationship Z6 < Z7 is established where Z6 is the input impedance of the first amplifier 24 and Z7 the input impedance of the second amplifier. Further, the impedance Z6 has a minimum value represented by R6'. Therefore, the signals of 1 MHz or more enter the first amplifier 24. Since the first amplifier 24 is impedance-matched with the coaxial cable 21, no reflection signal is produced in the signal path. Therefore, pulse signals with little waveform distortion are obtained from the output terminal of the first amplifier 24. The pulse signals are amplified by the third amplifier 26 and counted by the pulse counting system 27.

When the frequencies of the output signals from the detector 20 range from approximately 1 kHz to 10 kHz, that is, when the output signals are the lower frequency Campbell signals, the impedance Z7 of the input impedance circuit 25a and the input impedance of the first amplifier 24 satisfy the relation Z6 ≧ Z7, and the impedance Z7 has a minimum value. Accordingly, the Campbell signals from the detector 20 smoothly enter the second amplifier 25 for low frequency band amplification. The resistance R7' of the input resistor R7 of the input impedance circuit 25a is set high, as mentioned above. Accordingly, the Campbell signals in the above frequency band can be produced from the second amplifier 25 with the improved S/N characteristic. The output signals (Campbell signals) from the second amplifier 25 are amplified by the fourth amplifier 28 for the lower band Campbell signal amplification and are then applied to the Campbelling system 30 through the selection switch 31. Even in the case where the level of the Campbell signal from the detector 20 is low, the Campbell signal can be measured with high accuracy. Further, the measuring range in the pulse signal counting system 27 can satisfactorily overlap that of the Campbelling system 30. This feature improves the reliability of the measurement.

When the pulse rate of the detected signal from the neutron detector 20 increases and it is allowed to measure the neutron flux level by the high frequency Campbelling method, the switching signal 32 is applied from the Campbelling system 30 to the selection switch 31. Upon reception of the switching signal 32, the selection switch 31 connects the output terminal of the fifth amplifier 29 to the input terminal of the Campbelling system 30. In this case, the first amplifier 24 receives the Campbell signals from the detector 20 through the low resistance R6'. Therefore, the S/N of the first amplifier 24 is degraded. In this situation, however, the pulse rate of the input signals is satisfactorily high, so that the Campbell signal can be amplified. Further, the Campbell signal contains the high frequency component. This high frequency component enables the Campbelling system 30 to provide an output signal with a short response time and a small fluctuation factor I'.

Figure 1:
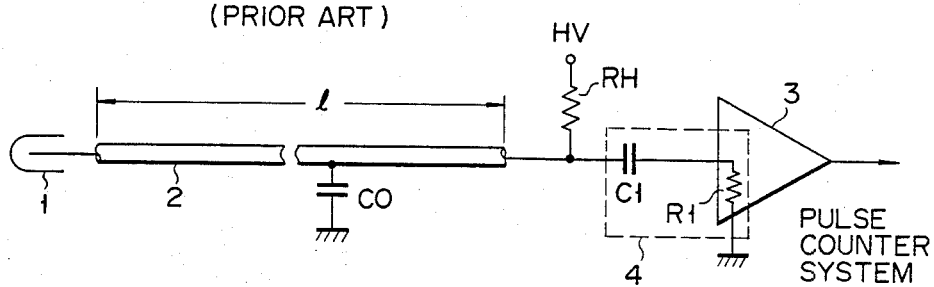
FIG. 1 is a block diagram of a prior neutron flux level measuring device using pulse signal measurement.
Figure 2:
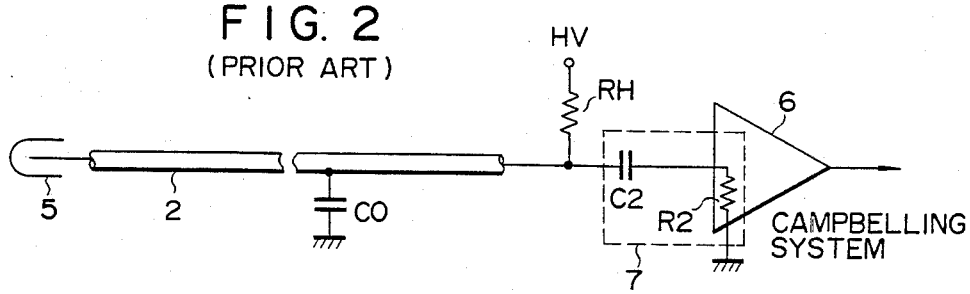
FIG. 2 is a block diagram of a prior neutron flux level measuring device using Campbell signal measurement.
Figure 3:
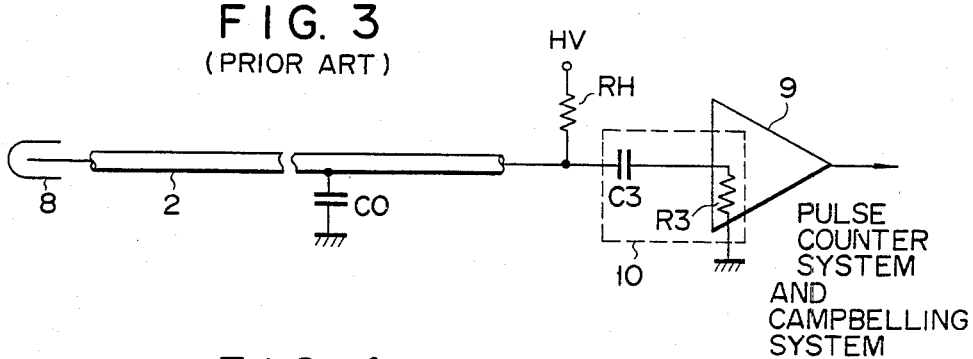
FIG. 3 is a block diagram of a prior art measuring device for measuring wide range neutron flux levels.
Figure 4:
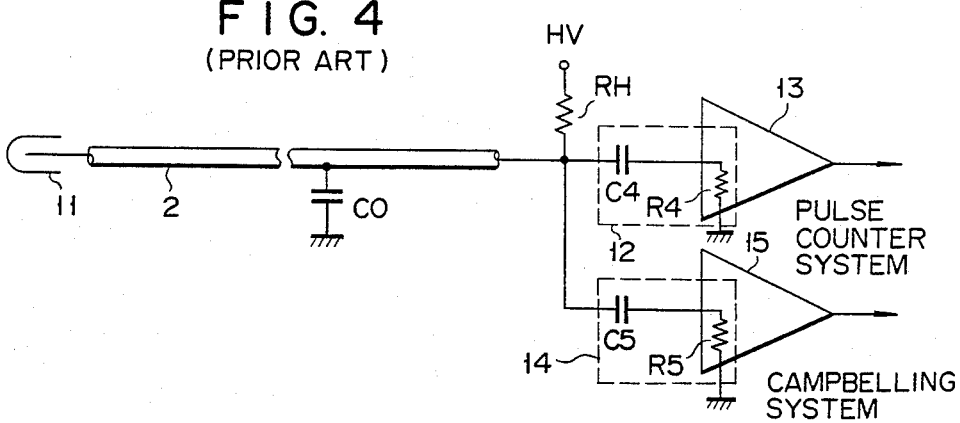
FIG. 4 is a block diagram of another measuring device for measuring wide range neutron flux levels.
Figure 5:
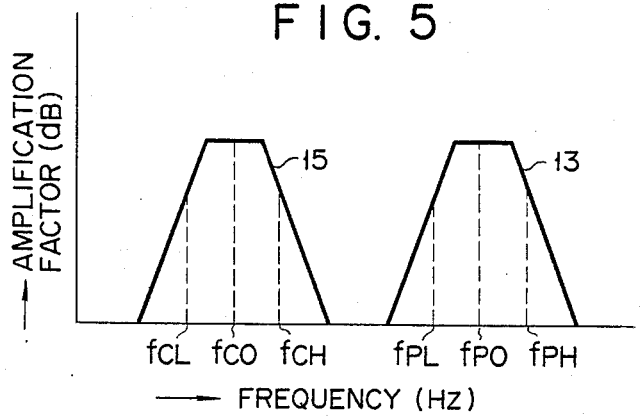
FIG. 5 shows a graph illustrating a relationship of the amplification factor versus the frequency of the amplifiers shown in FIG. 4.
Figure 6:
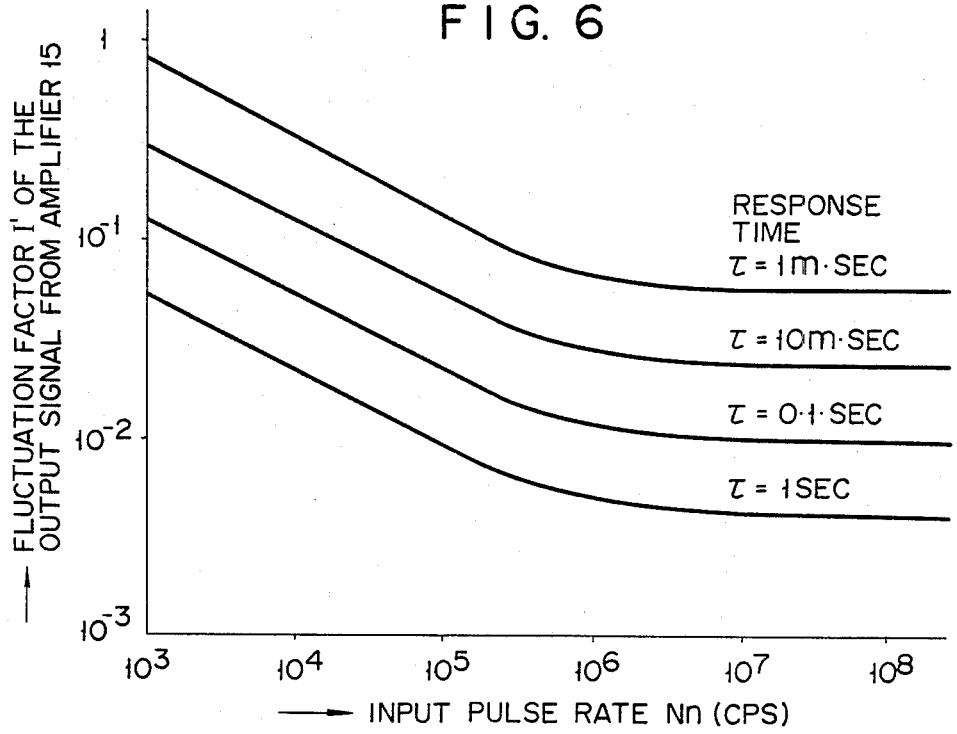
FIG. 6 shows a graph illustrating a fluctuation factor versus pulse rate, with a parameter of response time when the neutron flux level is measured by the measuring device of FIG. 4.
Figure 8:
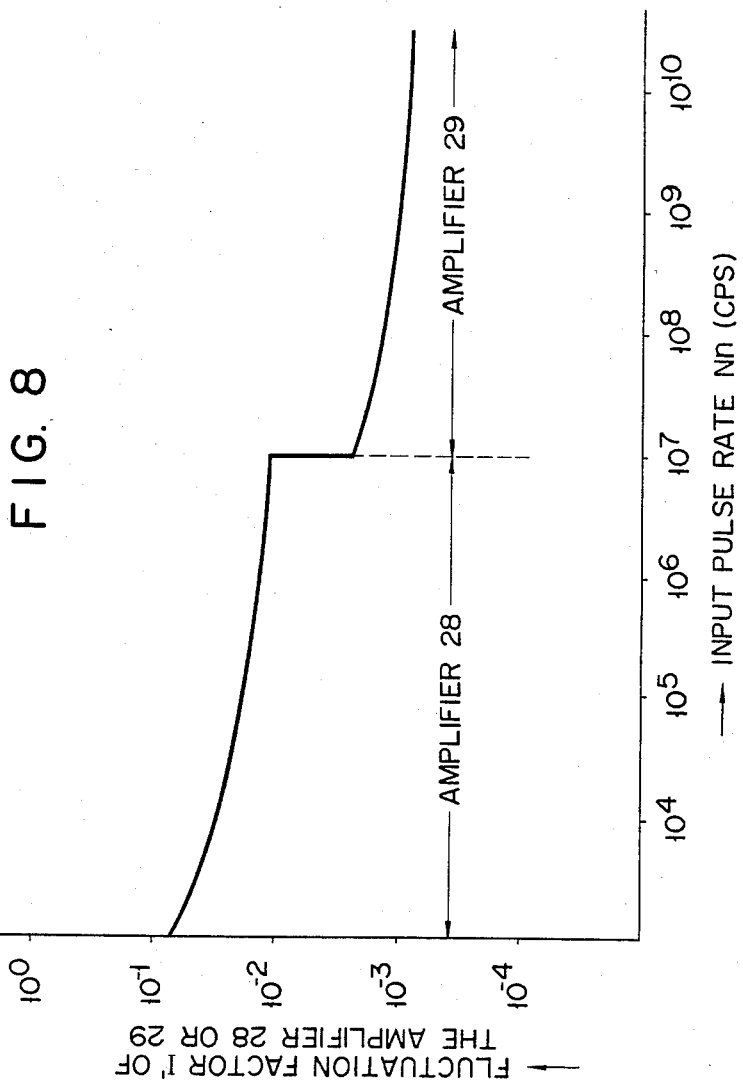
FIG. 8 graphically shows a relationship of a fluctuation factor versus input pulse rate when the preamplifier in FIG. 7 is used.

FIG. 8 shows a relationship of a fluctuation factor I' of the output signals from the Campbelling system 30 to the pulse rate (Nn) of the input signal to the preamplifier 22. In this graph, in the range from $10^3$ c.p.s to $10^7$ c.p.s of the pulse rate, the Campbell signal amplifier (4th amplifier) 28 connected to the Campbelling system 30 amplifies the output signals of the second amplifier 25, and, in the range of $10^7$ c.p.s or more, the Campbell signal amplifier (5th amplifier) 29 connected to the Campbelling system 30 amplifies the output signals of the first amplifier 24. When comparing this graph with that of FIG. 6, it will be seen that the measuring device of this embodiment remarkably improves the fluctuation factor and shortens the response time.

Figure 9:
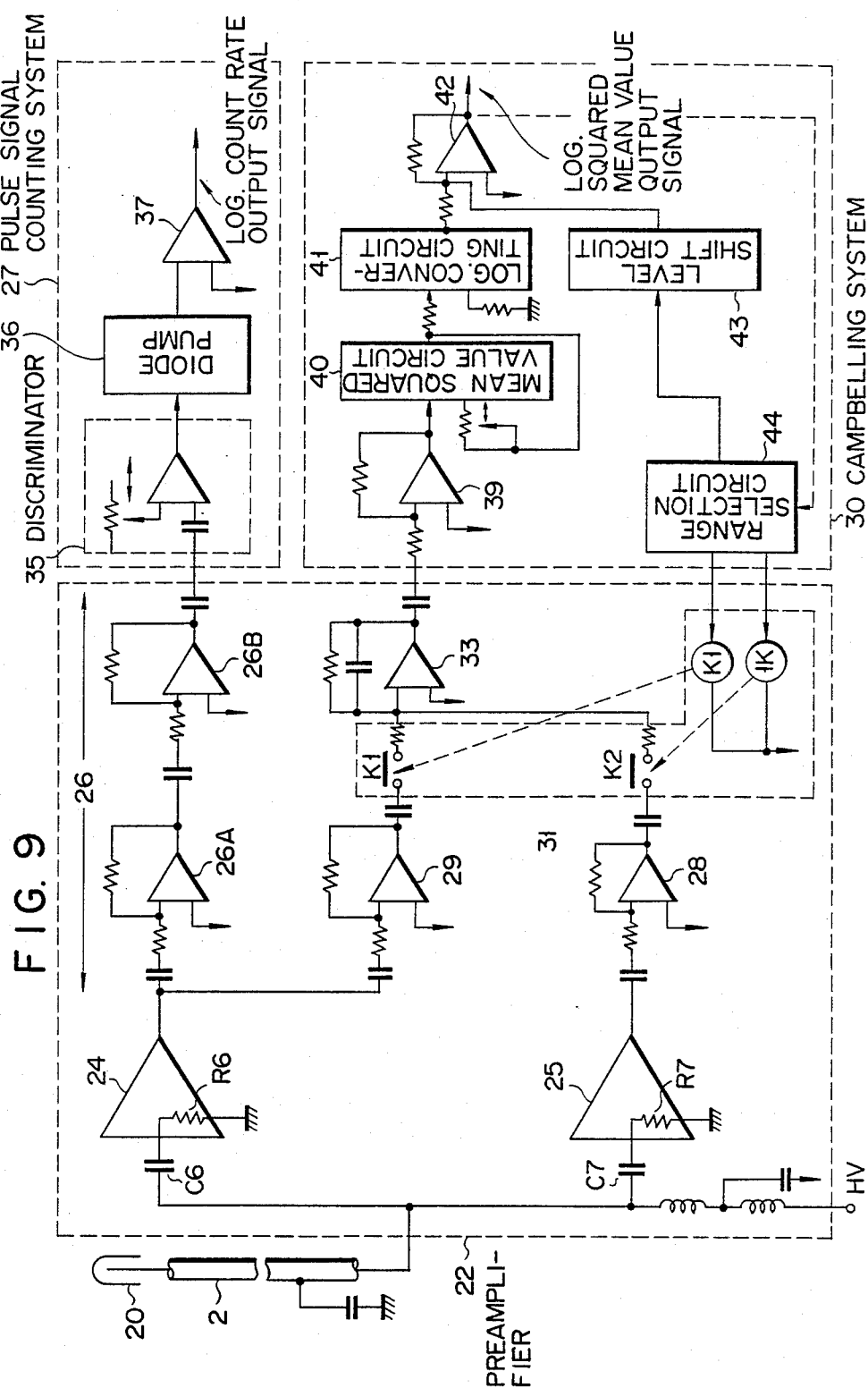
FIG. 9 is a functional diagram of the device shown in FIG. 7.

Turning now to FIG. 9, a functional diagram of the measuring device is shown in FIG. 7. For simplicity, like reference numerals are applied to like or equivalent portions. In FIG. 9, the third amplifier 26 is made up of amplifiers 26A and 26B. An amplifier 33 is connected between the Campbelling system 30 and the selection switch 31. The pulse signal counting system 27 contains a discriminator 35, a diode pump 36 and an amplifier 37, which are connected in series. The amplifier 37 produces a logarithm count rate output signal. The Campbelling system 30 includes a buffer amplifier 39, a circuit 40 for obtaining a mean squared value of the effective value of the output signal from the amplifier 39, a logarithm converting circuit 41 and an amplifier 42, which are connected in series. Further, a circuit 44 for controlling the switch 31 and a level shift circuit 43 are contained. As a matter of course, the switch 31 is automatically operated by driving the circuit 44 with the output signal from the amplifier 42. The detailed description of the pulse signal counting system 27 and the Campbelling system 30 are omitted here, since these are not essential to this invention.

What is claimed is:

1. A preamplifier for a wide range neutron flux monitoring system, which is supplied with wide range neutron flux level signals from a neutron detector provided in a reactor, comprising:
   a first amplifier for a high frequency band which includes a low input impedance circuit receiving at the input terminal thereof said wide range neutron flux level signals;
   a second amplifier for a low frequency band which includes a high input impedance circuit receiving at the input terminal thereof said wide range neutron flux level signals;
   a third amplifier for amplifying the pulse signals supplied from the output terminal of said first amplifier and for supplying the output signals therefrom to a pulse signal counting system;
   a fourth amplifier for a low frequency band which receives the output signals from said second amplifier and amplifies Campbell signals of a first frequency range, said Campbell signals being included in said output signals from said second amplifier;
   a fifth amplifier for a high frequency band which receives the output signals from said first amplifier and amplifies Campbell signals of a second frequency range, said Campbell signals being included in said output signals from said first amplifier; and
   switching means for selectively switching the output signals from said fourth and fifth amplifiers to a Campbelling system.

2. A preamplifier according to claim 1, wherein
   said low input impedance circuit of said first amplifier includes a first coupling capacitor and a first input resistor connected in series, the capacitance of said first coupling capacitor being set such that, when said low input impedance circuit receives at the input terminal thereof signals having a frequency above 1 MHz, the impedance of said low input impedance circuit is equal to the resistance of said first input resistor; and
   said high input impedance circuit of said second amplifier includes a second coupling capacitor and a second input resistor connected in series, said capacitance of said second coupling capacitor being set such that, when said high input impedance circuit receives at the input terminal thereof signals above 1 kHz, the impedance of said high input impedance circuit is equal to the resistance of said second input resistor.

3. A preamplifier according to claim 2, wherein
   when the resistance of said first input resistor is represented by R6', the resistance of said second input resistor by R7', the impedance of said low input impedance circuit by Z6 and the impedance of said high input impedance circuit by Z7, the conditions of $R7' > R6'$, $Z6 < Z7$ for a frequency above 1 MHz, and $Z6 \geq Z7$ for a frequency between 1 kHz and 10 kHz are established.

4. A preamplifier according to claim 1, wherein
   the impedance of said low input impedance circuit of said first amplifier is matched with that of a coaxial cable provided between said neutron flux level detector and the input terminal of said low input impedance circuit.

* * * * *